(12) United States Patent
Willmott

(10) Patent No.: US 8,487,179 B2
(45) Date of Patent: Jul. 16, 2013

(54) SYSTEM AND METHOD FOR THE IMPROVEMENT OF PHOTOVOLTAIC CELL EFFICIENCY

(76) Inventor: Rebecca Grace Willmott, McLean, VA (US)

( * ) Notice: Subject to any disclaimer, the term of this patent is extended or adjusted under 35 U.S.C. 154(b) by 519 days.

(21) Appl. No.: 12/027,649

(22) Filed: Feb. 7, 2008

(65) Prior Publication Data
US 2009/0199889 A1 Aug. 13, 2009

(51) Int. Cl.
*H02N 6/00* (2006.01)

(52) U.S. Cl.
USPC ............ 136/246; 136/259; 136/261; 136/262

(58) Field of Classification Search
USPC .................................................. 136/243–265
See application file for complete search history.

(56) References Cited

U.S. PATENT DOCUMENTS

| | | | | |
|---|---|---|---|---|
| 5,902,417 | A * | 5/1999 | Lillington et al. | 136/246 |
| 6,268,558 | B1 * | 7/2001 | Kubota | 136/244 |
| 2004/0093809 | A1 * | 5/2004 | Winarski | 52/173.3 |
| 2007/0227581 | A1 * | 10/2007 | Chen et al. | 136/246 |
| 2009/0314332 | A1 * | 12/2009 | Barnett et al. | 136/246 |

OTHER PUBLICATIONS

Handbook of Photovolatic Science and Engineering (edited by Antonio Luque and Steven Hegedus), published online Jan. 28, 2005), p. 729, figure 16.6, and p. 934 §20.7.*
Venema, A lens less ordinary, Nature, vol. 420, Nov. 2002, p. 119.*
Yang et al., High Efficiency GaAs / Si Monolithic Three-Terminal Cascade Solar Cells Grown by Metal-Organic Chemical Vapor Deposition, Japanese Journal of Applied Physics, vol. 33, pp. L712-L714, (1994).*
NASA, Visible Light Waves, http://science.hq.nasa.gov/kids/imagers/ems/visible.html (last retrieved Mar. 17, 2010).*
"Delaware to Lead $53 Million Program to Develop Very High Efficiency Solar Cell" *Honsburg*. 2006. University of Delaware. Retrieved Oct. 22, 2006. <http://www.ece.udel.edu/%7Ehonsberg/50percent.htm>.
"Did you know?" Einstein Year. 2006. The Physics Institute. Retrieved Jan. 5, 2006. <http://www.einsteinyear.org/facts/physicsFacts>.
"How do Photovoltaics Work?" Science @NASA. Gil Knier. 2002. Retrieved Oct. 2, 2005. <http://science.nasa.gov/headlines.y2002/solarcells.htm>.
Kayali, S., "GaAs Material Properties" GaAs Properties. 2006. NASA. Retrieved Oct. 23, 2006. <http://parts.jpl.nasa.gov/mmic/3-I.PDF>.
"MSDS for Gallium Arsenide." Wafer Technology: Request Quotation. 2006. Retrieved Oct. 5, 2006. <http://www.wafertech.co.uk/msds_gaas.html>.
"Photovoltaic Fundamentals." Photovoltaics-PV Basics. Florida Solar Energy Center. 2005. Retrieved Sep. 29, 2005. <http://www.fsec.ucf.edu/pvt/pvt/pvbasics/index.htm>.

(Continued)

*Primary Examiner* — Xiuyu Tai
(74) *Attorney, Agent, or Firm* — Hunton & Williams LLP

(57) ABSTRACT

A system and method for increasing photovoltaic cell efficiency is provided, comprising a photovoltaic cell, a filter covering the photovoltaic cell at a first angle to the photovoltaic cell, and a mirror positioned adjacent to the filter at a second angle to the photovoltaic cell, the mirror operable to reflect light into the filter.

16 Claims, 5 Drawing Sheets

OTHER PUBLICATIONS

"4.3 Work Function." Work Function 4.3. National Physical Laboratory. 2006. Retrieved Oct. 5, 2006. <http://www.kayelaby.npl.co.uk/atomic_and_nuclear_physics/4_3>.

"Light as a Particle?" Topic 3 Particle Model of Light. Retrieved Oct. 4, 2006. <http://www.antonine-education.co.uk/physics_AS/Module_1>.

"Optimum Orientation of Solar Panels." Macs Lab. Retrieved Jan. 20, 2007. <http://www.macslab.com/optsolar.html>.

"Photoelectric Effect." The Photoelectric Effect. Jan. 18, 2003. Retrieved Oct. 5, 2006. <http://www.walter-fendt.de/ph14e/photoeffect.htm>.

"Table of Units and Unit Conversions." Oklahoma State University. Retrieved Oct. 5, 2006. <http://frontpage.okstate.edu/nanotech/links>.

"Terrestrial Solutions, Extraterrestrial Utility." Cornell University. Retrieved Oct. 4, 2006. <http://www.crf.cornell.edu>.

"The Photoelectric Effect." Hertz Finds Maxwell's Waves: and Something Else. University of Virginia. 1997. Retrieved Oct. 5, 2006. <http://www.galileo.phys.virginia.edu/classes/252/photoelectric_effect.html>.

MSDS for Indium Arsenide; Wafer Tech. Retrieved Oct. 5, 2006. <http:www.wafertech.co.uk/msds/msds_gaas.html>.

"Solar Energy: Collection, Energy Generation and Heat Transfer"; Solar Collection and Energy Transport; The Electronic Universe Project, 2001; Retrieved Sep. 30, 2005. http://zebu.uoregon.edu/1996/ph162/l5.html.

"Solar Energy Society of Canada Inc."; Photovoltaic Solar Energy; Nov. 25, 1997; Retrieved Sep. 30, 2005; http://www.newenergy.org/sesci/publications/pamphlets/photovoltaic.html.

Gallium Arsenide Wafers; www.watertech.co.uk/data/GaAs.html; Retrieved Oct. 5, 2006.

Indium Arsenide Wafers; www.watertech.co.uk/data/InAs.html; Retrieved Oct. 5, 2006.

Gallium Antimonide Wafers; www.watertech.co.uk/data/GaSb.html; Retrieved Oct. 5, 2006.

MSDS for Gallium Antimonide; www.watertech.co.uk/msds/msds_GaSb.html; Retrieved Oct. 5, 2006.

* cited by examiner

SYSTEM AND METHOD FOR THE IMPROVEMENT OF PHOTOVOLTAIC CELL EFFICIENCY

FIELD OF THE INVENTION

The present invention relates to a system and method for improving photovoltaic cell efficiency by the use of one or more filters.

BACKGROUND OF THE INVENTION

Photovoltaic cells provide clean, non-polluting energy by converting light, either natural sunlight or artificial light, into electricity. Photovoltaic cell efficiency has increased, but photovoltaic cells still do not convert 100% of available light into electricity. At best, photovoltaic cells in a laboratory environment may convert 50% of light into electricity. Commercially available photovoltaic cells may have an efficiency closer to 30%. Photovoltaic cell efficiency is dependent on, for example, the chemical makeup of the photovoltaic cell, the wavelengths of light that reach the photovoltaic cell, and the temperature of the photovoltaic cell.

Photovoltaic cells may have a range of efficiency, and may not convert the entire light spectrum into electricity with equal efficiency. Photovoltaic cells may only convert discrete wavelengths or ranges of wavelengths of light energy into electricity, and may not convert certain wavelengths of light energy into electricity at all. For example, some photovoltaic cells may not convert visible light into electricity. Additionally, different photovoltaic cell compositions may be more efficient at converting different wavelengths of light energy into electricity. For example, silicon photovoltaic cells may be most efficient (i.e., convert the largest percentage of available light energy into electricity) when the wavelength of light is approximately 980-1180 nanometers. Gallium arsenide photovoltaic cells may be most efficient at a different wavelength range. Photovoltaic cells may also work most efficiently in a certain range of operating temperatures. A photovoltaic cell may be most efficient at, for example, 70 degrees Fahrenheit, and may not be as efficient at, for example, −20 degrees Fahrenheit or at 100 degrees Fahrenheit.

Light which is not converted to electricity may be absorbed, reflected, or transmitted through the photovoltaic cell. Light energy absorbed by the photovoltaic cell but not converted into electricity may be converted into heat energy. This heat energy may warm the photovoltaic cell, and may move the photovoltaic cell out of the optimum temperature range for maximum efficiency. This decreased efficiency may not be desirable from an operational standpoint, or may even adversely affect the lifespan of the photovoltaic cell.

SUMMARY OF THE INVENTION

Accordingly, various embodiments of the present invention directed to a system and method for photovoltaic cell efficiency improvements are provided. An apparatus may comprise a filter, a first mirror, a second mirror, a photovoltaic cell, a first support, and a second support. The filter may allow light energy of specific wavelengths to be transmitted to the photovoltaic cell, which may at least approximately overlap with the photovoltaic cell's band gap properties. The filter, the first mirror, the second mirror, the photovoltaic cell, the first support, and the second support may be arranged so that light energy may strike the filter. Such light energy may be selectively transmitted through the filter, or may be selectively absorbed or reflected by the filter, depending on the filter's transmission properties. Light energy may strike the first mirror and be substantially reflected or partially reflected into the filter, where the remaining light energy may be transmitted or reflected or absorbed according to the properties of the filter. The transmitted light energy may strike the second mirror and be substantially or partially reflected onto the photovoltaic cell. The photovoltaic cell may thus be exposed to light energy corresponding to the photovoltaic cell's band gap properties, and the waste light energy that the photovoltaic cell may not properly convert into electricity or may inefficiently convert into electricity may be absorbed or reflected by the filter, the first mirror, or the second mirror, or a combination thereof.

In an alternate embodiment, an apparatus may comprise a first filter, a first photovoltaic cell, a first mirror, a second mirror, a second photovoltaic cell, and a second filter. The first photovoltaic cell may be positioned underneath the first filter and adjacent to the first mirror, and the second photovoltaic cell may be positioned underneath the second filter and adjacent to the second mirror. The filters may have dichroic properties. The first dichroic filter and the second dichroic filter may have distinct transmission profiles, so that light energy reflected by the first dichroic filter may be transmitted by the second dichroic filter, and light reflected by the second dichroic filter may be transmitted by the first dichroic filter. Additionally, the first photovoltaic cell and the second photovoltaic cell may have substantially distinct band gap properties, so that the band gap of the first photovoltaic cell is partially or substantially different than the band gap of the second photovoltaic cell. Light energy may strike the first dichroic filter and the second dichroic filter, and may be reflected or transmitted according to the transmission profile of the first dichroic filter and the second dichroic filter. The light energy initially reflected by the first dichroic filter or the second dichroic filter may be reflected into each other, so that the second dichroic filter receives reflected light energy from the first dichroic filter and vice versa. The light energy may be selectively transmitted or reflected according to the transmission profiles of the first dichroic filter and the second dictiroic filter. Each photovoltaic cell may thus be exposed to light energy corresponding to the photovoltaic cell's band gap properties, and the waste light energy that the photovoltaic cell may not properly convert into electricity or may inefficiently convert into electricity may be absorbed or reflected by the first dichroic filter and the second dichroic filter.

Other embodiments are also within the scope of the invention.

BRIEF DESCRIPTION OF THE DRAWINGS

The present invention, together with further objects and advantages, may best be understood by reference to the following description taken in conjunction with the accompanying drawings, in the several Figures of which like reference numerals identify like elements, and in which.

DETAILED DESCRIPTION

The following description is intended to convey a thorough understanding of the embodiments described by providing a number of specific embodiments and details involving systems and methods for increased photovoltaic cell efficiency. It should be appreciated, however, that the present invention is not limited to these specific embodiments and details, which are exemplary only. It is further understood that one possessing ordinary skill in the art, in light of known systems and methods, would appreciate the use of the invention for its intended purposes and benefits in any number of alternative embodiments, depending on specific design and other needs.

Figure 1:
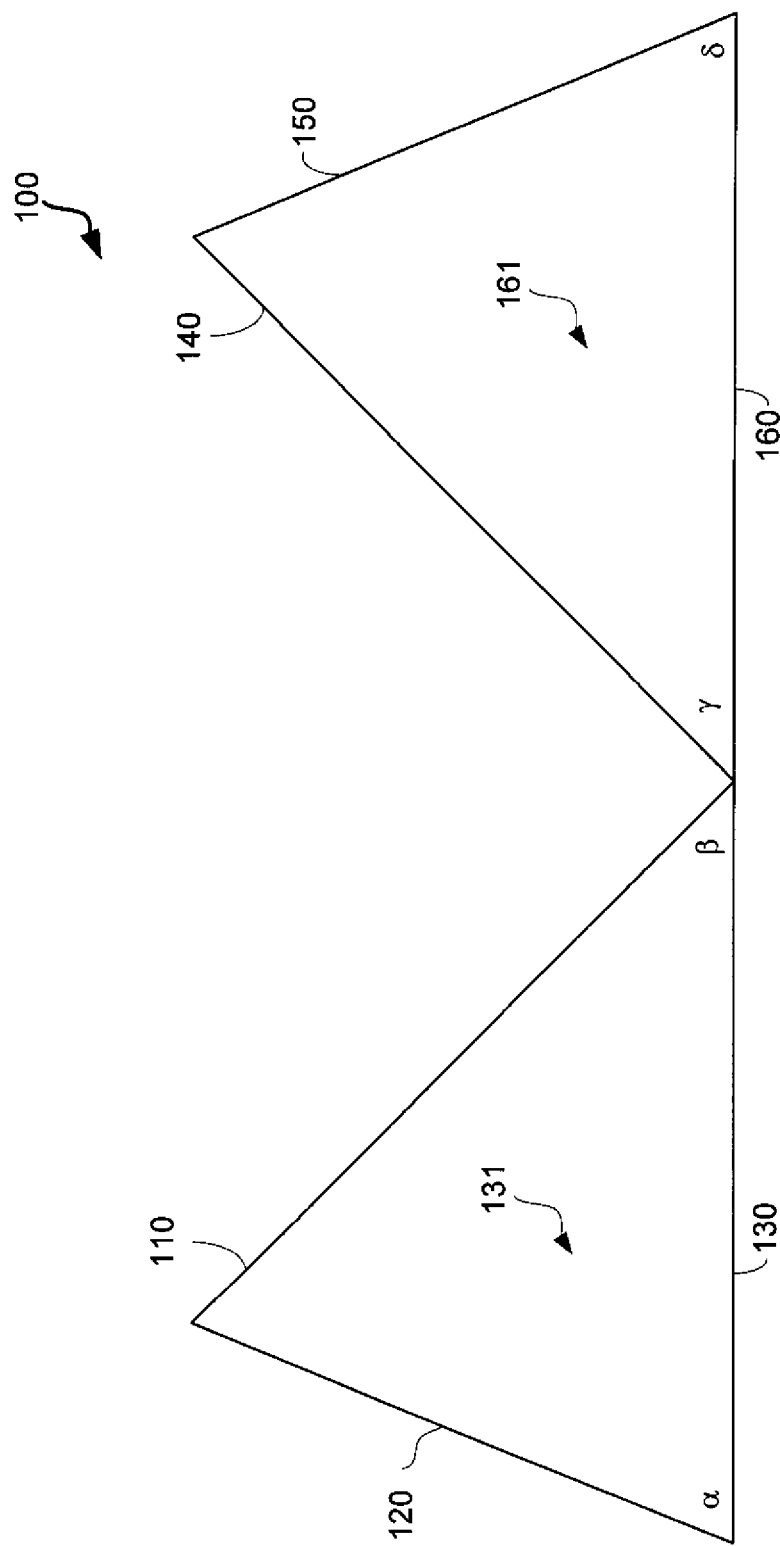
FIG. 1 is a side view of a photovoltaic cell efficiency improvement apparatus, according to one embodiment of the present invention.

Turning to FIG. 1, a side view of a photovoltaic cell efficiency improvement apparatus 100 is shown according to one embodiment of the present invention.

The filter 110 may extend over the photovoltaic cell 130, so that, for example, the filter 110 is substantially the same area as the photovoltaic cell 130. The filter 110 and the photovoltaic cell 130 may abut one another, forming an angle depicted in FIG. 1 as β. The angle β is preferably in the range of 40 to 50 degrees, and is most preferably substantially 45 degrees. The filter 10 may be formed from a selectively transparent material, so that light energy striking the filter 10 may be selectively allowed to pass, and selectively reflected or absorbed, depending on the wavelength of the light energy. For example, the filter 110 may be formed from a material known as a "1×26" light filter, manufactured or distributed by Rosco Laboratories, Inc. The material may have properties which allow light energy having a wavelength greater than approximately 760 nanometers to pass through the filter 110, and the filter 110 may absorb or reflect light energy of approximately less than 760 nanometers. Waste light energy may be defined as light energy which is absorbed or reflected by the filter 110. In the current example, the waste light energy has the wavelength range of less than 760 nanometers. The filter 110 may substantially absorb the waste light energy, or may substantially reflect the waste light energy. Of course, other filters having other light selection properties may be used. A filter 110 and photovoltaic cell 130 pair in which light energy having wavelengths overlapping or otherwise matching the photovoltaic cell's efficiency range is allowed to pass through the filter may be desirable.

The photovoltaic cell 130 may extend underneath the filter 110 so that, for example, the photovoltaic cell 130 may be approximately the same area as the filter 110. The photovoltaic cell 130 may be operable to convert light energy striking the photovoltaic cell 130 into electricity. The process by which the photovoltaic cell 130 converts light energy into electricity, and the mechanism that removes electricity from of the photovoltaic cell 130 and processes the electricity to accomplish work, is well known in the art. With the filter 110 described above, filtering much of the light energy having a wavelength below 760 nanometers, one choice of photovoltaic cell 130 is a silicon photovoltaic cell. A silicon photovoltaic cell 130 may have a range of efficiency or a band gap range, and may be most efficient at converting light energy of between approximately 980 to 1180 nanometers into electricity. Of course, other photovoltaic cells may be used with the present invention, and such use is within the scope of the present invention. A filter 110 and photovoltaic cell 130 pair in which the filter allows light energy of a range which overlaps or contains some of the wavelengths of light at which the photovoltaic cell is most efficient may be desirable.

A first mirror 140 may be located on the outside of the apparatus. The first mirror 140 may be substantially flat, and may be positioned so that light energy striking the first mirror 140 may be substantially reflected onto the filter 110. The first mirror 140 and the first support 160 may abut one another, forming an angle depicted in FIG. 1 as γ. The angle γ is preferably in the range of 40 to 50 degrees, and is most preferably substantially 45 degrees. The first mirror 140 may be formed from any material which is substantially reflective of light energy which the photovoltaic cell 130 may absorb and convert into electricity. For example, the first mirror 140 may be formed from a polished metal, or may be formed from a silvered substrate. Alternatively, the first mirror 140 may be partially mirrored, so that the first mirror 140 may absorb one or more wavelengths of light. In this way, the first mirror 140 may absorb some or all of the waste light energy before it is reflected to the filter 110.

A second mirror 120 may be placed within the apparatus, enclosing the photovoltaic cell 130 and forming a triangle with the filter 110, and may enclose a void 131 therein. The second mirror 120 may be substantially flat, and may be positioned so that light energy passing through the filter 110 from the first mirror 140 may strike the second mirror 120 and be reflected onto the photovoltaic cell 130. The second mirror 120 and the filter 10 may abut one another. The second mirror 120 and the photovoltaic cell 130 may abut one another, forming an angle depicted in FIG. 1 as α. The angle a is preferably in the range of 60 to 75 degrees, and is most preferably substantially 67.5 degrees. The second mirror 120 may be formed from any material which is substantially reflective of light energy which the photovoltaic cell 130 may absorb and convert into electricity. For example, the second mirror 120 may be formed from a polished metal, or may be formed from a silvered substrate. Alternatively, the second mirror 120 may be partially mirrored, so that the second mirror 120 absorbs one or more wavelengths of light. In this way, the second mirror 120 may absorb some or all of the waste light energy before it is reflected to the photovoltaic cell 130.

The first support 160 and the second support 150 may be operable to place the first mirror 140 into a position so that the first mirror 140 reflects some or most of the light energy which strikes the first mirror 140 into the filter 110. The first support 160 and the second support 150 may be formed from a suitable material to support the first mirror 140 and to keep the first mirror 140 substantially in position. The first support 160 and the second support 150 may abut one another, forming an angle depicted in FIG. 1 as δ. The angle δ is preferably in the range of 60 to 75 degrees, and is most preferably substantially 67.5 degrees. In an alternate embodiment of the present invention, the first support 160 and the second support 150 may be formed singularly. In another alternate embodiment of the present invention, the void 161 created by the union of the first mirror 140, the first support 160, and the second support 150 may be occupied, so that the first support 160 and the second support 150 may be formed from a single, solid material onto which the first mirror 140 is positioned.

Figure 1A:
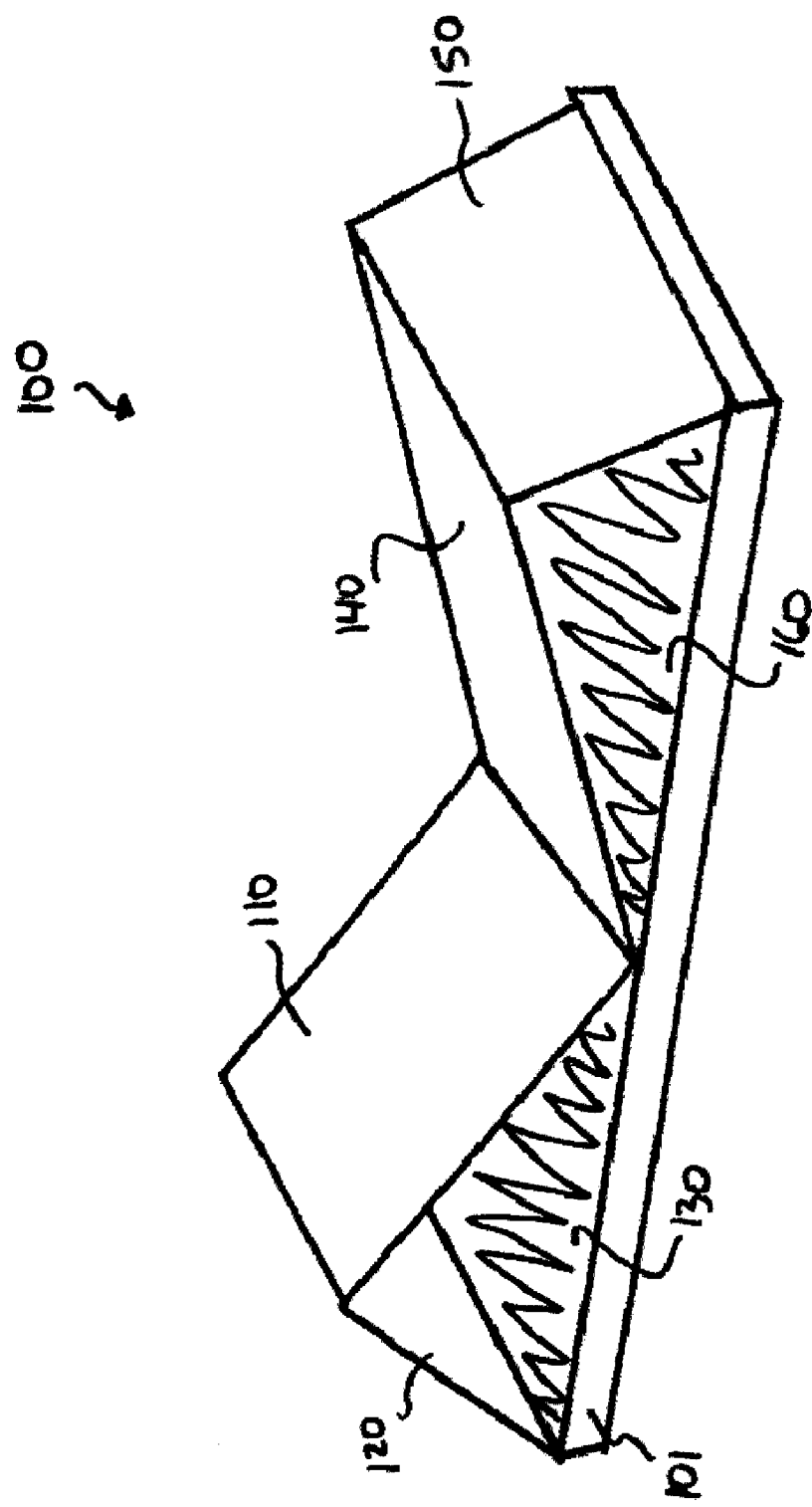
FIG. 1a is a side offset view of a photovoltaic cell efficiency improvement apparatus, according to one embodiment of the present invention.

Turning now to FIG. 1a, a side offset view of the photovoltaic cell 130 efficiency improvement device shown in FIG. 1 is shown according to one embodiment of the present invention. The apparatus may rest on a base 101, formed from a suitable material to allow for a connection point between the photovoltaic cell 130 and the base 101, and to substantially maintain the angles α, β, γ, and δ. The base 101 may also be attached to a pivot, so that the base 101 may be positioned in order to reflect a maximum amount of light from the sun or other light producing object. For example, the base may move on the pivot so that the apparatus faces the sun or artificial light source optimally at different times of the day.

Figure 2:
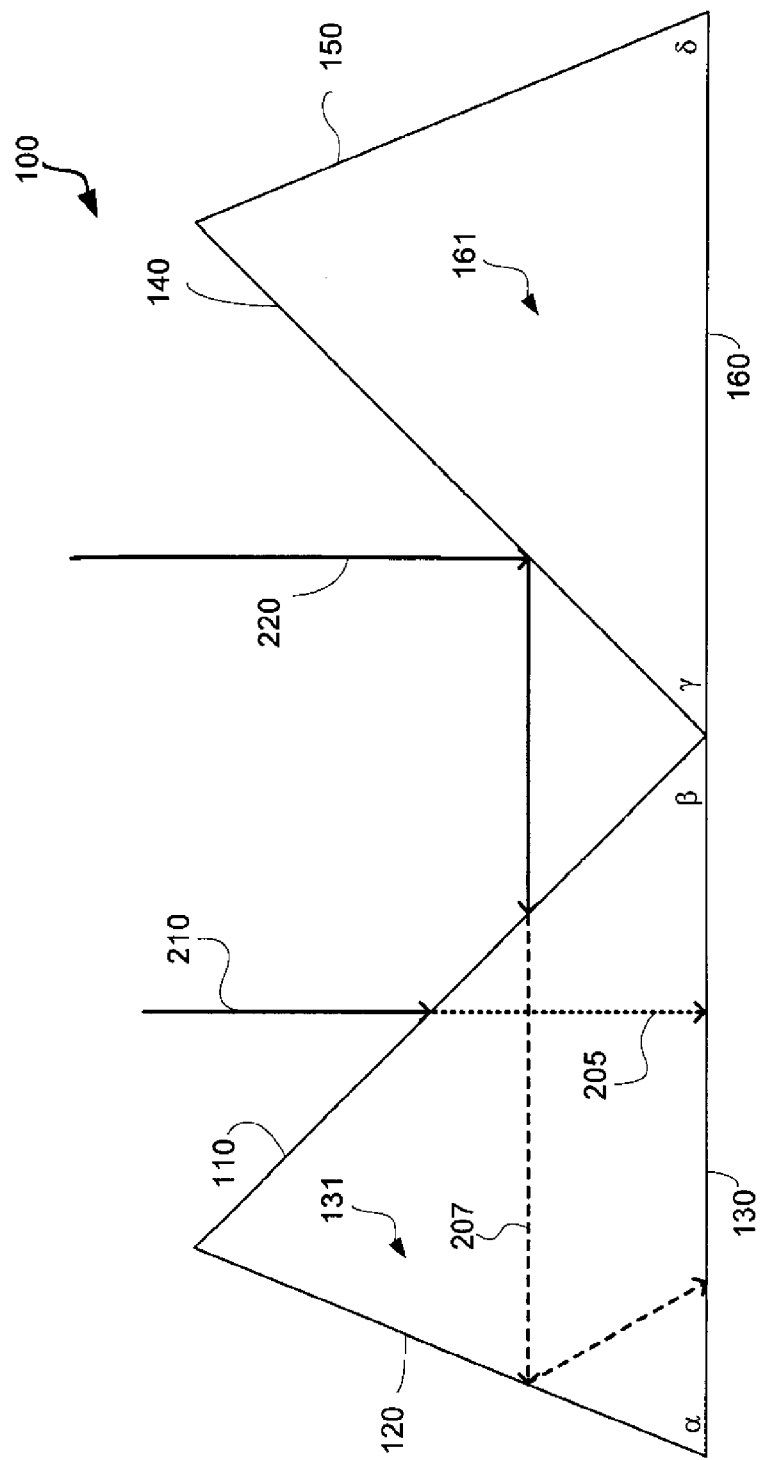
FIG. 2 is a side view of a photovoltaic cell efficiency improvement apparatus, showing exemplary light rays according to one embodiment of the present invention.

Turning now to FIG. 2, a side view of a photovoltaic cell 130 efficiency improvement device, with exemplary light rays showing operation of the device is shown according to one embodiment of the present invention. First light ray 210 and second light ray 220 may be similar in spectrum, and may include one or more wavelengths of light. First light ray 210 and second light ray 220 are presented for exemplary purposes only, in order to clarify the operation of the apparatus.

The first light ray 210 may strike the filter 10. The filter 110 may be operable to allow certain wavelengths of light energy contained within the first light ray 210 to pass through the filter 110, and may absorb or reflect the other light energy contained within the first light ray 210. For example, if the filter 110 is a "1×26" light filter, which allows light energy greater than 760 nanometers to pass, light energy contained within the first light ray 210 with a wavelength greater than 760 nanometers may be allowed to pass through the filter 110, and light energy contained within the first light ray 210 with a wavelength of approximately less than 760 nanometers may not be allowed to pass through the filter 110, The light energy not allowed to pass through the filter 110 may be absorbed or reflected by the filter 110. The light energy contained within the first light ray 210 which is allowed to pass through the filter 110 may become the first filtered light ray 205. The first filtered light ray 205 may enter the void 131, and may strike the photovoltaic cell 130. The photovoltaic cell 130 may utilize some or all of the light energy contained within the first filtered light ray 205 and convert the light energy into electricity. The process of converting light energy into electricity by the use of a photovoltaic cell 130 is well known in the art.

The second light ray 220 may strike the first mirror 140. The first mirror 140 may be operable to reflect substantially all of the light energy contained within the second light ray 220 into the filter 10. In an alternate embodiment, the first mirror 140 may be operable to absorb some or all of the light energy contained within the second light ray 220, allowing only certain wavelengths to be reflected into the filter 110. The second light ray 220 reflected from the first mirror 140 may strike the filter 110. The filter 110 may be operable to allow certain wavelengths of light energy contained within the second light ray 220 to pass through the filter 110, and may absorb or reflect the other light energy contained within the second light ray 220. The light energy contained within the second light ray 220 not allowed to pass through the filter 110 may be absorbed or reflected by the filter 110. The light energy contained within the second light ray 220 which is allowed to pass through the filter 110 may become the second filtered light ray 207. The second filtered light ray 207 may enter the void 131, and may strike the second mirror 120. The second mirror 120 may be operable to reflect substantially all of the light energy contained within the second filtered light ray 207 into the photovoltaic cell 130. In an alternate embodiment, the second mirror 120 may be operable to absorb some or all of the light energy contained within the second light ray 220, allowing only certain wavelengths to be reflected onto the photovoltaic cell 130. The photovoltaic cell 130 may utilize some or all of the light energy contained within the second filtered light ray 207 and convert the light energy into electricity. The process of converting light energy into electricity by the use of the photovoltaic cell 130 is well known in the art.

In this manner, the amount of light energy focused on to the photovoltaic cell 130 may be increased by the use of the first mirror 140 and second mirror 120, thus allowing a greater amount of light energy to reach the photovoltaic cell 130. Additionally, the use of the filter 110 may allow more light energy compatible with the band gap of the photovoltaic cell 130 to be focused on to the photovoltaic cell 130, without also focusing an increased amount of waste light energy onto the photovoltaic cell 130.

The use of one or more dichroic filters in place of the filter and the first mirror may allow for an increased area of photovoltaic cells to be used with the device, and for the photovoltaic cells to receive an increased amount of light energy compatible with the photovoltaic cell's band gap properties.

Figure 3:
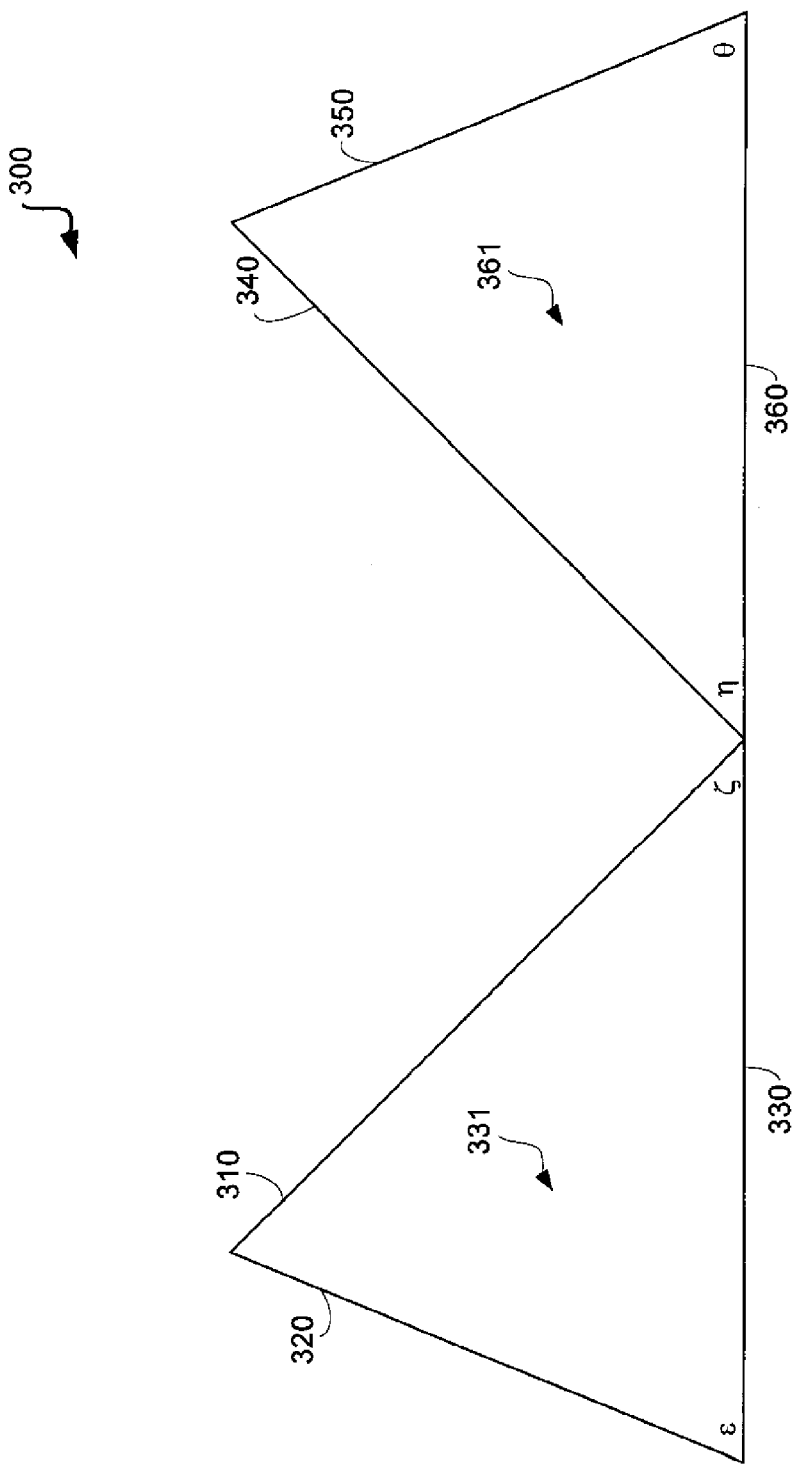
FIG. 3 is a side view of a dual cell photovoltaic cell efficiency improvement apparatus according to one embodiment of the present invention.

Turning now to FIG. 3, a side view of a dual cell photovoltaic cell efficiency improvement device according to one embodiment of the present invention is shown. One or more dichroic filters may be used to selectively filter light allowed to pass to one or more photovoltaic cells.

A first dichroic filter 310 may extend over the first photovoltaic cell 330, so that, for example, the first dichroic filter 310 may be substantially the same area as the first photovoltaic cell 330. The first dichroic filter 310 and the first photovoltaic cell 330 may abut one another, forming an angle depicted in FIG. 3 as ζ. The angle ζ is preferably in the range of 40 to 50 degrees, and is most preferably substantially 45 degrees. The first dichroic filter 310 may be placed at an angle suitable for the transmission characteristics of the filter. The first dichroic filter 310 may be formed from a selectively transparent material, so that light energy striking the filter may be selectively allowed to pass, and selectively reflected by the first dichroic filter 310. The material may have properties which allow light energy of approximately 980 to 1180 nanometers to pass through the filter, and the filter may reflect light energy of other wavelengths. Of course, other filters having other light selection properties may be used. A first dichroic filter 310 and first photovoltaic cell 330 pair in which light energy having wavelengths overlapping or otherwise matching the first photovoltaic cell efficiency range is allowed to pass through the first dichroic filter 310 is desirable.

The first photovoltaic cell 330 may extend underneath the first dichroic filter 310 so that, for example, the first photovoltaic cell 330 is approximately the same area as the first dichroic filter 310. The first photovoltaic cell 330 may be operable to convert light striking the first photovoltaic cell 330 into electricity. The process by which the first photovoltaic cell 330 converts energy into electricity, and the mechanism that removes electricity out of the first photovoltaic cell 330 and processes the electricity to accomplish work, is well known in the art. With the first dichroic filter 310 described above, filtering substantially all but the 980 to 1180 nanometer range of light energy, one choice for the first photovoltaic cell 330 may be the silicon photovoltaic cell. A silicon photovoltaic cell may have a range of efficiency, and may be most efficient at converting light energy of between approximately 980 and 1180 nanometers into electricity. Of course, other photovoltaic cells may be used with the device, and such use is within the scope of the present invention. A filter and photovoltaic cell pair in which the filter allows light energy of a range which overlaps or contains some of the wavelengths of light at which the photovoltaic cell is most efficient may be desirable.

A first mirror 320 is placed within the apparatus, enclosing the first photovoltaic cell 330 and forming a triangle with the first dichroic filter 310, and enclosing a first void 331 therein. The first mirror 320 may be substantially flat, and may be positioned so that light energy passing through the first dichroic filter 310 and reflected from the second dichroic filter 340 may strike the first mirror 320 and be reflected onto the first photovoltaic cell 330. The first mirror 320 and the first dichroic filter 310 may abut one another. The first mirror 320 and the first photovoltaic cell 330 may abut one another, forming an angle depicted in FIG. 3 as ϵ. The angle ϵ is preferably in the range of 60 to 75 degrees, and is most preferably substantially 67.5 degrees. The first mirror 320 may be formed from any material which is substantially reflective of light energy which the first photovoltaic cell 330 may absorb and convert into electricity. For example, the first mirror 320 may be formed from a polished metal, or may be formed from a silvered substrate. Alternatively, the first mirror 320 may be partially mirrored, so that the first mirror 320 may absorb one or more wavelengths of light. In this way, the first mirror 320 may absorb some or all of the waste light energy before it is reflected to the first photovoltaic cell 330.

A second dichroic filter 340 may extend over the second photovoltaic cell 360, so that, for example, the second dichroic filter 340 may be substantially the same area as the second photovoltaic cell 360. The second dichroic filter 340 and the second photovoltaic cell 360 may abut one another, forming an angle depicted in FIG. 3 as η. The angle η is preferably in the range of 40 to 50 degrees, and is most preferably substantially 45 degrees. The second dichroic filter 340 may be placed at an angle suitable for the transmission characteristics of the filter. The second dichroic filter 340 may be formed from a selectively transparent material, so that light energy striking the filter may be selectively allowed to pass, and selectively reflected by the second dichroic filter 340. For example, the second dichroic filter 340 may be formed from a material having properties which allow light of approximately 750 to 950 nanometers to pass through the filter, and the filter may reflect light energy of other wavelengths. Of course, other filters having other light selection properties may be used. A second dichroic filter 340 and second photovoltaic cell 360 pair in which light energy having wavelengths overlapping or otherwise matching the second photovoltaic cell's efficiency range is allowed to pass through the second dichroic filter 340 may be desirable.

The second photovoltaic cell 360 may extend underneath the second dichroic filter 340 so that, for example, the second photovoltaic cell 360 is approximately the same area as the second dichroic filter 340. The second photovoltaic cell 360 may be operable to convert light striking the second photovoltaic cell 360 into electricity. The process by which the second photovoltaic cell 360 converts energy into electricity, and the mechanism that removes electricity out of the second photovoltaic cell 360 and processes the electricity to accomplish work, is well known in the art. With the second dichroic filter 340 described above, filtering substantially all but the 750-950 nanometer range of light energy, one choice for the second photovoltaic cell 360 is the gallium arsenide photovoltaic cell. A gallium arsenide photovoltaic cell may have a range of efficiency, and may be most efficient at converting light energy of between approximately 750 and 950 nanometers into electricity. Of course, other photovoltaic cells may be used with the device, and such use is within the scope of the present invention. A filter and photovoltaic cell pair in which the filter allows light energy of a range which overlaps or contains some of the wavelengths of light at which the photovoltaic cell is most efficient is desirable.

A second mirror 350 may be placed within the apparatus, enclosing the second photovoltaic cell 360 and forming a triangle with the second dichroic filter 340, and enclosing a second void 331 therein. The second mirror 350 may be substantially flat, and may be positioned so that light energy passing through the second dichroic filter 340 and reflected from the second dichroic filter 340 may strike the second mirror 350 and be reflected onto the second photovoltaic cell 360. The second mirror 350 and the second dichroic filter 340 may abut one another. The second mirror 350 and the second photovoltaic cell 360 may abut one another, forming an angle depicted in FIG. 3 as θ. The angle θ is preferably in the range of 60 to 75 degrees, and is most preferably substantially 67.5 degrees. The second mirror 350 may be formed from any material which is substantially reflective of light energy which the second photovoltaic cell 360 may absorb and convert into electricity. For example, the second mirror 350 may be formed from a polished metal, or may be formed from a silvered substrate. Alternatively, the second mirror 350 may be partially mirrored, so that the second mirror 350 may absorb one or more wavelengths of light. In this way, the second mirror 350 may absorb some or all of the waste light energy before it is reflected to the second photovoltaic cell 360.

The first photovoltaic cell 330 and the second photovoltaic cell 360 may be formed from different compositions. For example, the first photovoltaic cell 330 may be formed from a composition where the cell is most efficient at converting light energy of the 980 to 1180 nanometer range into electricity. The second photovoltaic cell 360 may be formed from a composition where the cell is most efficient at converting light energy of the 750 to 950 nanometer range into electricity. Additionally, the first dichroic filter 310 and the second dichroic filter 340 may be comprised of different compositions. A first dichroic filter 310 which transmits a range of light energy partially or substantially overlapping with the band gap range of the first photovoltaic cell 330 may be desirable. A first dichroic filter 310 which reflects a range of light energy partially or substantially overlapping with the range of maximum efficiency of the second photovoltaic cell 360 may also be desirable. A second dichroic filter 340 which transmits a range of light energy partially or substantially overlapping with the band gap range of the second photovoltaic cell 360 may be desirable. A second dichroic filter 340 which reflects a range of light energy partially or substantially overlapping with the range of maximum efficiency of the first photovoltaic cell 330 may also be desirable. In this way, much or substantially all of the light energy striking the first dichroic filter 310 and the second dichroic filter 340, which partially or substantially overlaps with the range of maximum efficiency of the first photovoltaic cell 330 may be focused onto the first photovoltaic cell 330. Similarly, much or substantially all of the light energy striking the first dichroic filter 310 and the second dichroic filter 340, which partially or substantially overlaps with the range of maximum efficiency of the second photovoltaic cell 360 may be focused onto the second photovoltaic cell 360.

Figure 4:
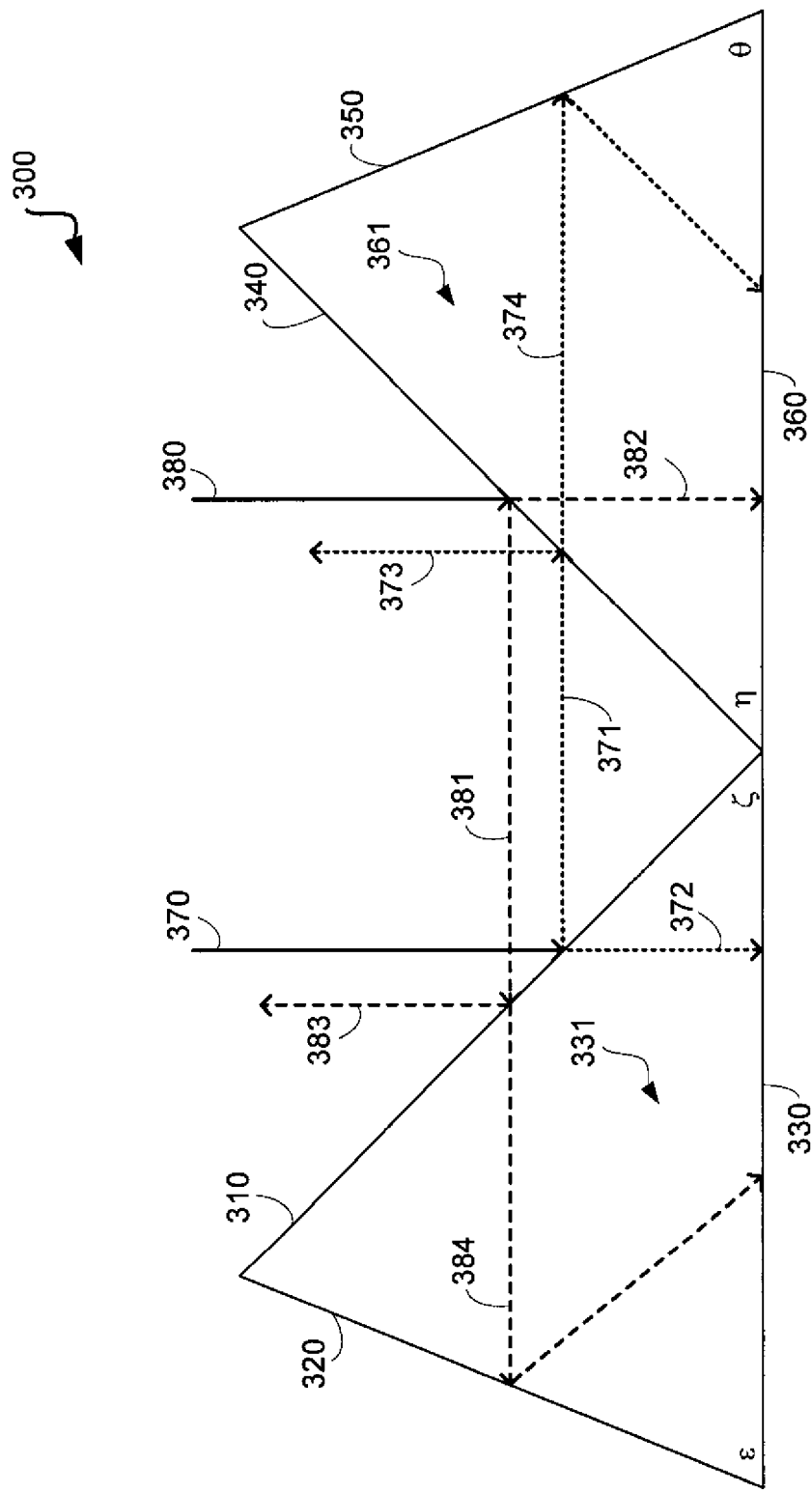
FIG. 4 is a side view of a duel cell photovoltaic cell efficiency improvement apparatus, showing exemplary light rays according to one embodiment of the present invention.

Turning now to FIG. 4, a side view of a duel cell photovoltaic cell efficiency improvement device, showing exemplary light rays according to one embodiment of the present invention, is shown. First light ray 370 and second light ray 380 may be similar in spectrum, and may include one or more than one wavelengths of light. First light ray 370 and second light ray 380 are presented for exemplary purposes only, in order to clarify the operation of the apparatus.

The first light ray 370 may strike the first dichroic filter 310. The first dichroic filter 3 10 may be operable to allow certain wavelengths of light energy contained within the first light ray 370 to pass through the first dichroic filter 310, and may absorb or reflect the other light energy contained within the first light ray 370. For example, if the first dichroic filter 310 is a dichroic filter having a transmission range of 980 to 1180 nanometers, light energy contained within the first light ray 370 with a wavelength of approximately 980 to 1180 nanometers may be allowed to pass through the first dichroic filter 310, and light energy contained within the first light ray 370 with other wavelengths may not be allowed to pass through the first dichroic filter 310. The light energy not allowed to pass through the first dichroic filter 310 may be absorbed or reflected by the first dichroic filter 310. The light energy contained within the first light ray 370 which is allowed to pass through the first dichroic filter 310 may become the first transmitted light ray 372. The light energy contained within the first light ray 370 which is reflected by the first dichroic filter 310 may become the first reflected light ray 371. The first transmitted light ray 372 may enter the void 331, and may strike the first photovoltaic cell 330. The first photovoltaic cell 330 may utilize some or all of the light energy contained within the first transmitted light ray 372 and convert the light energy into electricity. The process of converting light energy into electricity by the use of a photovoltaic cell is well known in the art.

The first reflected light ray 371 may be reflected from the first dichroic filter 310 and may strike the second dichroic filter 340. The second dichroic filter 340 may be operable to allow certain wavelengths of light energy contained within the first reflected light ray 371 to pass through the second dichroic filter 340, and may absorb or reflect the other light energy contained within the first reflected light ray 371. For example, if the second dichroic filter 340 is a dichroic filter having a transmission range of 750 to 950 nanometers, light energy contained within the first reflected light ray 371 with a wavelength of approximately 750 to 950 nanometers may be allowed to pass through the second dichroic filter 340, and light energy contained within the first reflected light ray 371 with other wavelengths may not be allowed to pass through the second dichroic filter 340. The light energy not allowed to pass through the second dichroic filter 340 may be absorbed or reflected by the second dichroic filter 340. The light energy contained within the first reflected light ray 371 which is allowed to pass through the second dichroic filter 340 may become the third transmitted light ray 374. The light energy contained within the first reflected light ray 371 which is reflected by the second dichroic filter 340 may become the first waste light ray 373. The third transmitted light ray may enter the void 361, and may strike the first photovoltaic cell 330. The first photovoltaic cell 330 may utilize some or all of the light energy contained within the third transmitted light ray 374 and convert the light energy into electricity. The process of converting light energy into electricity by the use of a photovoltaic cell is well known in the art.

The second light ray 380 may strike the second dichroic filter 340. The second dichroic filter 340 may be operable to allow certain wavelengths of light energy contained within the second light ray 380 to pass through the second dichroic filter 340, and may absorb or reflect the other light energy contained within the second light ray 380. For example, if the second dichroic filter 340 is a dichroic filter having a transmission range of 750 to 950 nanometers, light energy contained within the second light ray 380 with a wavelength of approximately 750 to 950 nanometers may be allowed to pass through the second dichroic filter 340, and light energy contained within the second light ray 380 with other wavelengths may not be allowed to pass through the second dichroic filter 340. The light energy not allowed to pass through the second dichroic filter 340 may be absorbed or reflected by the second dichroic filter 340. The light energy contained within the second light ray 380 which is allowed to pass through the second dichroic filter 340 may become the second transmitted light ray 382. The second transmitted light ray 382 may enter the void 331, and may strike the second photovoltaic cell 360. The second photovoltaic cell 360 may utilize some or all of the light energy contained within the second transmitted light ray 382 and convert the light energy into electricity. The process of converting light energy into electricity by the use of a photovoltaic cell is well known in the art.

The second reflected light ray 381 may be reflected from the second dichroic filter 340 and may strike the first dichroic filter 310. The first dichroic filter 310 may be operable to allow certain wavelengths of light energy contained within the second reflected light ray 381 to pass through the first dichroic filter 310, and may absorb or reflect the other light energy contained within the second reflected light ray 381. For example, if the first dichroic filter 310 is a dichroic filter having a transmission range of 980 to 1180 nanometers, light energy contained within the second reflected light ray 381 with a wavelength of approximately 980 to 1180 nanometers may be allowed to pass through the first dichroic filter 310, and light energy contained within the second reflected light ray 381 with other wavelengths may not be allowed to pass through the first dichroic filter 310. The light energy not allowed to pass through the first dichroic filter 310 may be absorbed or reflected by the first dichroic filter 310. The light energy contained within the second reflected light ray 381 which is allowed to pass through the first dichroic filter 310 may become the fourth transmitted light ray 384. The light energy contained within the second reflected light ray 381 which is reflected by the first dichroic filter 310 may become the second waste light ray 383. The fourth transmitted light ray 384 may enter the void 331, and may strike the second photovoltaic cell 360. The second photovoltaic cell 360 may utilize some or all of the light energy contained within the fourth transmitted light ray 384 and convert the light energy into electricity. The process of converting light energy into electricity by the use of a photovoltaic cell is well known in the art.

The present invention may encourage increased photovoltaic cell efficiency by blocking some waste light from reaching the photovoltaic cell. In this way, overall photovoltaic cell efficiency may be increased, leading to increased use and decreasing overall surface area required to generate the same amount of electricity. This may allow for photovoltaic cells to be used where they may not have been used previously, for example where size or weight requirements would not allow a traditional photovoltaic cell apparatus of appropriate size to generate the electricity needed for a particular task.

The embodiments of the present inventions are not to be limited in scope by the specific embodiments described herein. For example, other filters may be used with the apparatus to filter light energy from natural or artificial light. Or, the apparatus may be positioned on a rotating or tilt device so that the apparatus may be positioned ideally with respect to the light source. Or, different photovoltaic cells may be used with the apparatus which may have greater initial efficiency or a different band gap profile. Thus, such modifications are intended to fall within the scope of the following appended claims. Further, although some of the embodiments of the present invention have been described herein in the context of a particular implementation in a particular environment for a particular purpose, those of ordinary skill in the art should recognize that its usefulness is not limited thereto and that the embodiments of the present inventions can be beneficially implemented in any number of environments for any number of purposes. Accordingly, the claims set forth below should be construed in view of the full breadth and spirit of the embodiments of the present inventions as disclosed herein. While the foregoing description includes many details and specificities, it is to be understood that these have been included for purposes of explanation only, and are not to be interpreted as limitations of the invention. Many modifications to the embodiments described above can be made without departing from the spirit and scope of the invention.

What is claimed is:

1. An apparatus for increasing photovoltaic cell efficiency, comprising:
   a first photovoltaic cell;
   a second photovoltaic cell, positioned adjacent to the first photovoltaic cell;
   a first filter positioned adjacent to and abutting the first photovoltaic cell at a first angle to the first photovoltaic cell;
   a second filter positioned adjacent to and abutting the second photovoltaic cell at a second angle to the second photovoltaic cell, the second filter operable to reflect light into the first filter;
   a first mirror positioned adjacent to and abutting the first photovoltaic cell at a third angle to the first photovoltaic cell; and
   a second mirror positioned adjacent to and abutting the second photovoltaic cell at a fourth angle to the second photovoltaic cell.

2. An apparatus for increasing photovoltaic cell efficiency according to claim 1, wherein the first filter is a dichroic filter.

3. An apparatus for increasing photovoltaic cell efficiency according to claim 1, wherein the second filter is a dichroic filter.

4. An apparatus for increasing photovoltaic cell efficiency according to claim 1, wherein the first angle is in the range between 40 and 50 degrees.

5. An apparatus for increasing photovoltaic cell efficiency according to claim 1, wherein the first angle is substantially 45 degrees.

6. An apparatus for increasing photovoltaic cell efficiency according to claim 1, wherein the second angle is in the range between 40 and 50 degrees.

7. An apparatus for increasing photovoltaic cell efficiency according to claim 1, wherein the second angle is substantially 45 degrees.

8. An apparatus for increasing photovoltaic cell efficiency according to claim 1, wherein the first photovoltaic cell is a silicon photovoltaic cell.

9. An apparatus for increasing photovoltaic cell efficiency according to claim 1, wherein the first filter allows light energy corresponding to the band gap of the first photovoltaic cell to be transmitted through the first filter.

10. An apparatus for increasing photovoltaic cell efficiency according to claim 1, wherein the second photovoltaic cell is a gallium arsenide photovoltaic cell.

11. An apparatus for increasing photovoltaic cell efficiency according to claim 1, wherein the second filter allows light energy corresponding to the band gap of the second photovoltaic cell to be transmitted through the second filter.

12. An apparatus for increasing photovoltaic cell efficiency according to claim 1, wherein the first photovoltaic cell, the first filter, and the first mirror are positioned to form a first triangle.

13. An apparatus for increasing photovoltaic cell efficiency according to claim 1, wherein the second photovoltaic cell, the second filter, and the second mirror are positioned to form a second triangle.

14. A method for increasing photovoltaic cell efficiency, comprising
   providing a first photovoltaic cell;
   providing a second photovoltaic cell, positioned adjacent to the first photovoltaic cell;
   providing a first filter positioned adjacent to and abutting the first photovoltaic cell at a first angle to the first photovoltaic cell;
   providing a second filter positioned adjacent to and abutting the second photovoltaic cell at a second angle to the second photovoltaic cell, the second filter operable to reflect light into the first filter;
   providing a first mirror positioned adjacent to and abutting the first photovoltaic cell at a third angle to the first photovoltaic cell; and
   providing a second mirror positioned adjacent to and abutting the second photovoltaic cell at a fourth angle to the second photovoltaic cell.

15. A method for increasing photovoltaic cell efficiency according to claim 14, wherein the first photovoltaic cell, the first filter, and the first mirror are positioned to form a first triangle.

16. A method for increasing photovoltaic cell efficiency according to claim 14, wherein the second photovoltaic cell, the second filter, and the second mirror are positioned to form a second triangle.

* * * * *